(12) United States Patent
Shin et al.

(10) Patent No.: US 8,587,571 B2
(45) Date of Patent: Nov. 19, 2013

(54) MEMORY DEVICE WITH ONE-TIME PROGRAMMABLE FUNCTION, AND DISPLAY DRIVER IC AND DISPLAY DEVICE WITH THE SAME

(75) Inventors: Chang-Hee Shin, Chungcheongbuk-do (KR); Ki-Seok Cho, Chungcheongbuk-do (KR); Kwon-Young Oh, Chungcheongbuk-do (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 1120 days.

(21) Appl. No.: 12/424,848

(22) Filed: Apr. 16, 2009

(65) Prior Publication Data
US 2009/0284504 A1 Nov. 19, 2009

(30) Foreign Application Priority Data
May 15, 2008 (KR) .......................... 10-2008-0045127

(51) Int. Cl.
*G09G 5/00* (2006.01)
(52) U.S. Cl.
USPC .............................. 345/206; 345/204; 365/94
(58) Field of Classification Search
USPC ............... 345/204–215, 87–102; 365/189.07, 365/189.09, 94
See application file for complete search history.

(56) References Cited

U.S. PATENT DOCUMENTS

| | | | | |
|---|---|---|---|---|
| 7,764,278 B2 * | 7/2010 | Kumagai et al. | | 345/204 |
| 8,035,662 B2 * | 10/2011 | Yajima et al. | | 345/690 |
| 8,184,488 B2 * | 5/2012 | May et al. | | 365/189.09 |
| 8,264,446 B2 * | 9/2012 | Lee et al. | | 345/100 |
| 2003/0169222 A1 * | 9/2003 | Burkhardt | | 345/87 |
| 2005/0206641 A1 * | 9/2005 | Morita | | 345/211 |
| 2006/0114719 A1 | 6/2006 | Lee | | |
| 2007/0008681 A1 * | 1/2007 | Park | | 361/600 |
| 2007/0164967 A1 * | 7/2007 | Osame | | 345/98 |
| 2008/0136847 A1 * | 6/2008 | Yajima et al. | | 345/690 |
| 2008/0238953 A1 * | 10/2008 | Ogura | | 345/697 |
| 2008/0278190 A1 * | 11/2008 | Ong et al. | | 324/765 |
| 2009/0213129 A1 * | 8/2009 | Li | | 345/544 |
| 2012/0188216 A1 * | 7/2012 | Gu et al. | | 345/211 |

OTHER PUBLICATIONS

Taiwanese Office Action issued on Mar. 11, 2013 in Taiwanese Patent Application No. 098113549. (8 pages including English translation).

* cited by examiner

*Primary Examiner* — Dmitriy Bolotin
(74) *Attorney, Agent, or Firm* — NSIP Law (57) ABSTRACT

A display driver IC with a built-in memory device having a one-time programmable function is provided. The memory device includes: a cell array comprising a plurality of one-time programmable unit cells and configured to receive a writing voltage generated from an internal voltage generating unit to operate upon writing operation; a detecting unit configured to detect a change of the writing voltage; and a controlling unit configured to control the internal voltage generating unit and the unit cells according to an output signal of the detecting unit.

10 Claims, 11 Drawing Sheets

MEMORY DEVICE WITH ONE-TIME PROGRAMMABLE FUNCTION, AND DISPLAY DRIVER IC AND DISPLAY DEVICE WITH THE SAME

CROSS-REFERENCE TO RELATED APPLICATIONS

The present invention claims priority of Korean Patent Application No. 10-2008-0045127, filed on May 15, 2008, which is incorporated herein by reference.

BACKGROUND OF THE INVENTION

1. Field of the Invention

The present invention relates to a small display driver integrated chip (DDI) including one-chip solution; and, more particularly, to a display driver integrated circuit (IC) with a built-in memory device having a one-time programmable function.

2. Description of Related Art

A memory device having a one-time programmable (OTP) function is an internal memory device which is provided in a non-memory semiconductor IC such as a driver IC, for example, a liquid crystal display (LCD) driver IC, and has non-volatile characteristic that retains data even when power is cut off.

Figure 1:
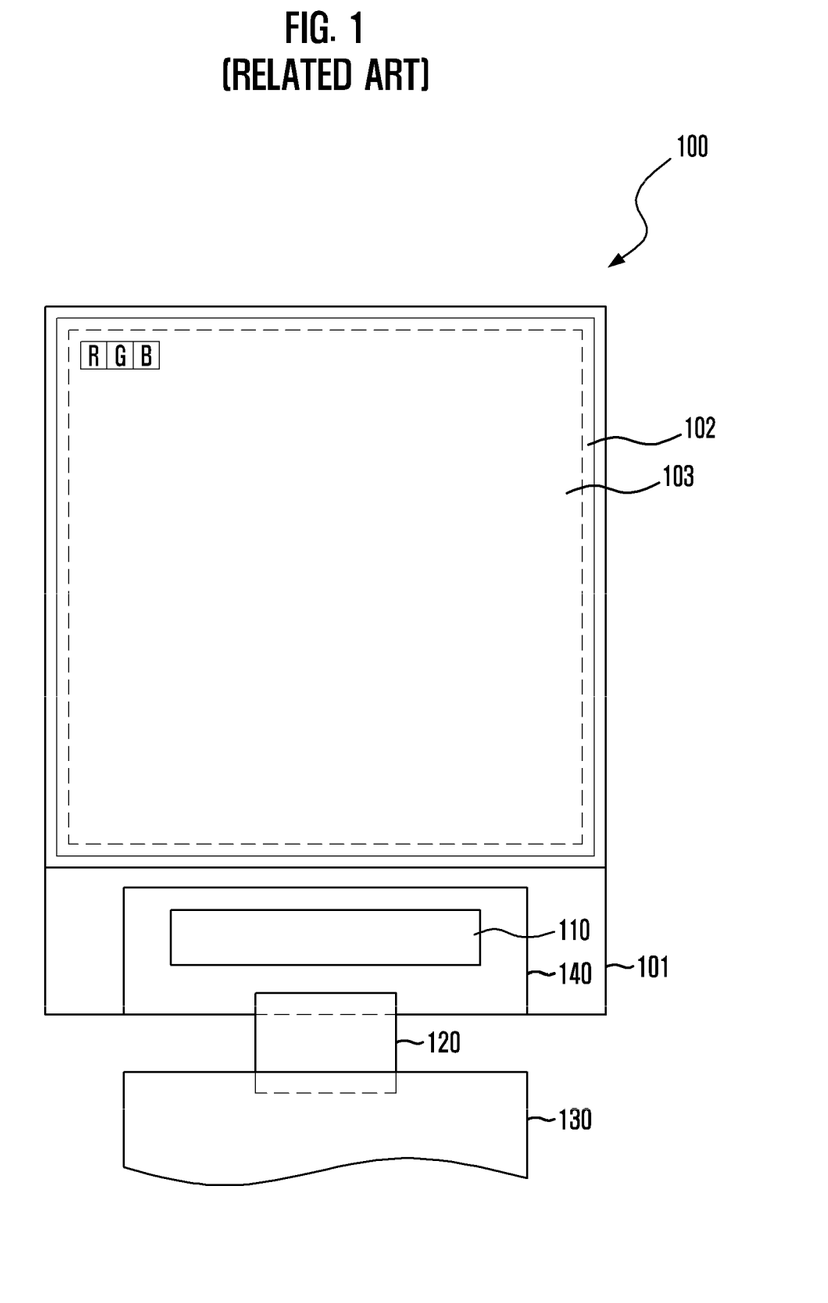
FIG. 1 is a plan view of a general LCD.
Figure 2:
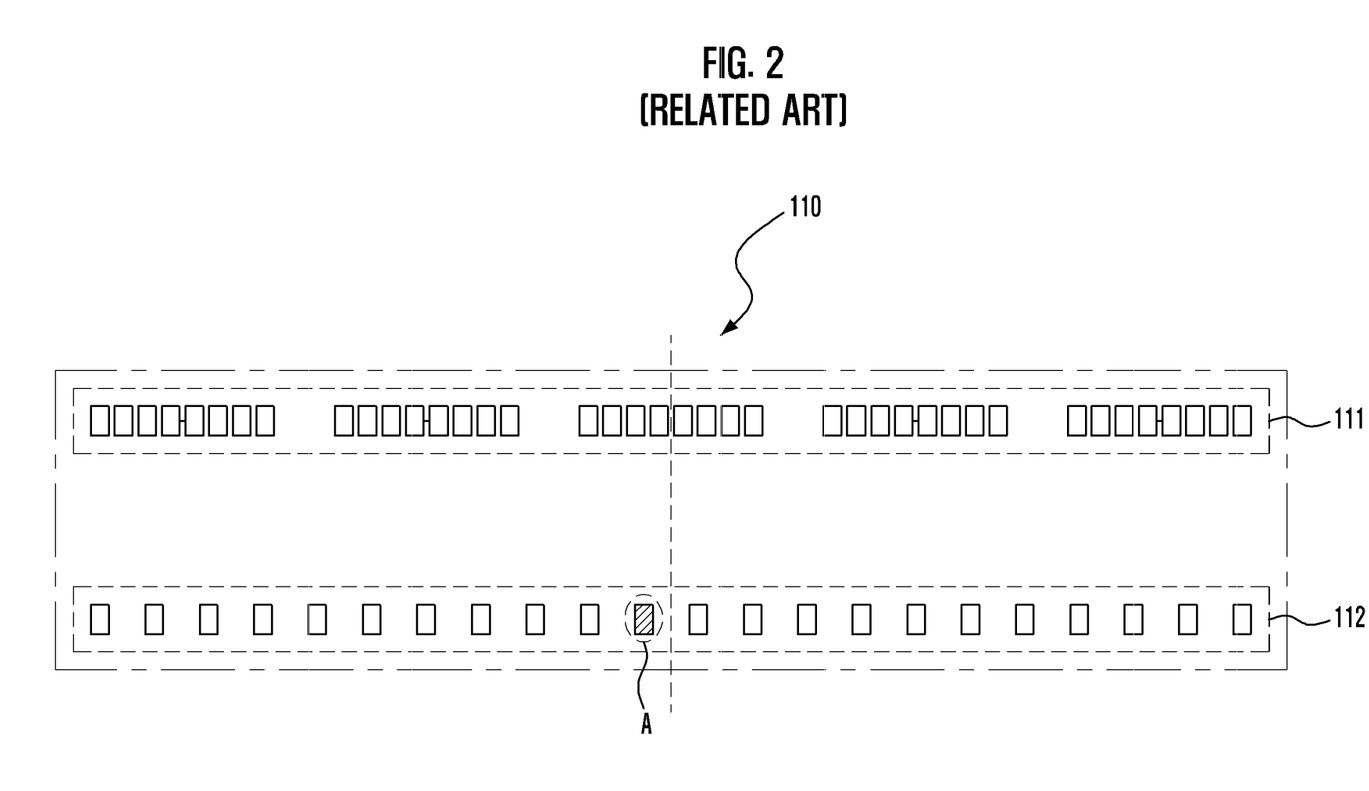
FIG. 2 is a plan view illustrating a rear surface of a driver IC of FIG. 1 which is disposed to face a lower substrate of a liquid crystal panel.

FIG. 1 is a plan view of a general LCD. FIG. 2 is a plan view illustrating a rear surface of a driver IC of FIG. 1 which is disposed to face a lower substrate of a liquid crystal panel.

Referring to FIGS. 1 and 2, the general LCD includes a liquid crystal panel 100, a driver IC 110 driving the liquid crystal panel 100, a driving circuit 130 controlling the driver IC 110, and a flexible substrate 120 connecting the driver IC 110 to the driving circuit 130.

The liquid crystal panel 100 includes a lower substrate 101 on which a plurality of gate lines, a plurality of data lines, a plurality of thin film transistors (TFTs) and a plurality of pixel electrodes are formed, an upper substrate 102, disposed to face the lower substrate 101, on which a plurality of color filters and a common electrode are formed, and a liquid crystal layer (not shown) disposed between the lower substrate 101 and the upper substrate 102. Herein, a polarizer 103 may be attached to the both surfaces of the lower substrate 101 and the upper substrate 102.

The driver IC 110 is a non-memory semiconductor device, and includes a gate driver, a source driver, an internal voltage generating unit, and a main logic unit. Moreover, the driver IC 110 is a memory device and includes a static random access memory (SRAM), which is a volatile memory device, and an OTP, which is a nonvolatile memory device.

The driver IC 110 is mounted on the one side of the lower substrate 101. At this point, an anisotropic conductive film 140 is attached to a plurality of electrode joining portions formed on the lower substrate 101, and the driver IC 110 and the flexible substrate 120 are mounted on the anisotropy conductive film 140 by a heat-press process.

As illustrated in FIG. 2, a plurality of output pads 111 and a plurality of input pads 112 are disposed on the rear surface of the driver IC 110. The output pads 111 are respectively connected to a plurality of electrodes formed on the lower substrate 101, and the input pads 112 are connected to the flexible substrate 120.

The input pad 112 includes a pad (see 'A') to which a writing voltage is applied upon OTP writing operation. Herein, the pad for an OTP writing voltage is connected to the driving circuit 130 through the flexible substrate 120. Furthermore, the disposition of the pad for the OTP writing voltage is not limited to the disposition illustrated in FIG. 2, and the pad may be disposed in a suitable disposition of the driver IC 110 according to the disposition of the OTP.

Upon OTP writing operation, the writing voltage is an external voltage, and is applied through the driving circuit 130. The writing voltage applied to the driving circuit 130 is applied to the pad for the OTP writing voltage through the flexible substrate 120. The writing voltage applied to the pad for the OTP writing voltage is applied to the anti-fuse of an OTP unit cell so that it causes the dielectric breakdown of a gate dielectric formed in the anti-fuse.

However, since the pad for the OTP writing voltage is left as a floating state after the completion of the OTP writing operation, it causes a leakage current. After the OTP writing operation, a pad for the application of an external voltage of the driving circuit 130 connected to the pad for the OTP writing voltage is separated from a power supply source supplying the external voltage so that it is left as a floating state. Accordingly, the pad for the OTP writing voltage connected to the pad for the application of the external voltage of the driving circuit 130 is also left as a floating state, thereby causing noise due to a leakage current.

SUMMARY OF THE INVENTION

An embodiment of the present invention is directed to a display driver IC including an OTP, which is not affected by noise due to a pad for an OTP writing voltage.

Another embodiment of the present invention is directed to a display device, which includes a display driver IC with a built-in OTP and is not affected by noise due to a pad for an OTP writing voltage.

Another embodiment of the present invention is directed to an OTP, which can perform a writing operation by using an internal voltage.

In accordance with an aspect of the present invention, there is provided a display device, including: a display panel; and a driver integrated chip (IC) comprising a built-in internal voltage generating unit configured to generate an internal voltage, a built-in memory device having a one-time programmable function, a first pad configured to output the internal voltage, and a second pad configured to receive a writing voltage of the memory device. The display panel includes: first and second connection ports connected to the respective first and second pads upon mounting of the driver IC; and a first substrate on which an internal interconnection configured to interconnect the first and second connection pads are disposed.

In accordance with another aspect of the present invention, there is provided a display driver integrated chip (IC) including: a built-in internal voltage generating unit configured to receive an external voltage to generate an internal voltage; and a built-in memory device having a one-time programmable function, wherein the memory device is connected to the internal voltage generating unit through a first internal interconnection for receiving the internal voltage generated from the internal voltage generating unit as a writing voltage to operate upon writing operation.

In accordance with another aspect of the present invention, there is provided a memory device, including: a cell array comprising a plurality of one-time programmable unit cells and configured to receive a writing voltage generated from an internal voltage generating unit to operate upon writing operation; a detecting unit configured to detect a change of the writing voltage; and a controlling unit configured to control the internal voltage generating unit and the unit cells according to an output signal of the detecting unit.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

The advantages, features and aspects of the invention will become apparent from the following description of the embodiments with reference to the accompanying drawings, which is set forth hereinafter. In description on each embodiment, a liquid crystal panel, moreover, will be described as an example of a display panel. However, the spirit and scope of the present invention is not limited to the liquid crystal panel, and includes all sorts of display panels driven by a driver IC with a built-in OTP. In an internal configuration of a driver IC in accordance with each embodiment, configurations except details associated with the present invention, moreover, can be configured identically to a general configuration.

Embodiment 1

Figure 3:
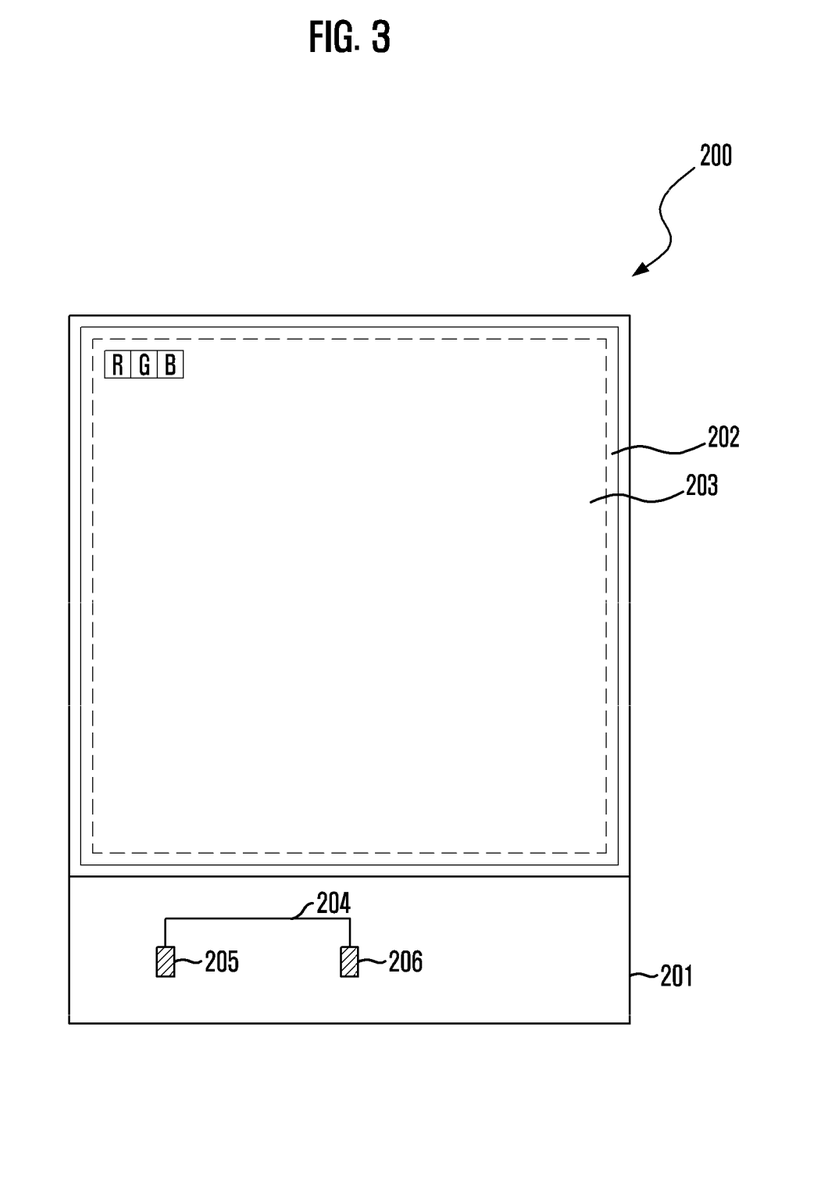
FIG. 3 is a plan view illustrating a display panel of a display device in accordance with an embodiment of the present invention.
Figure 4:
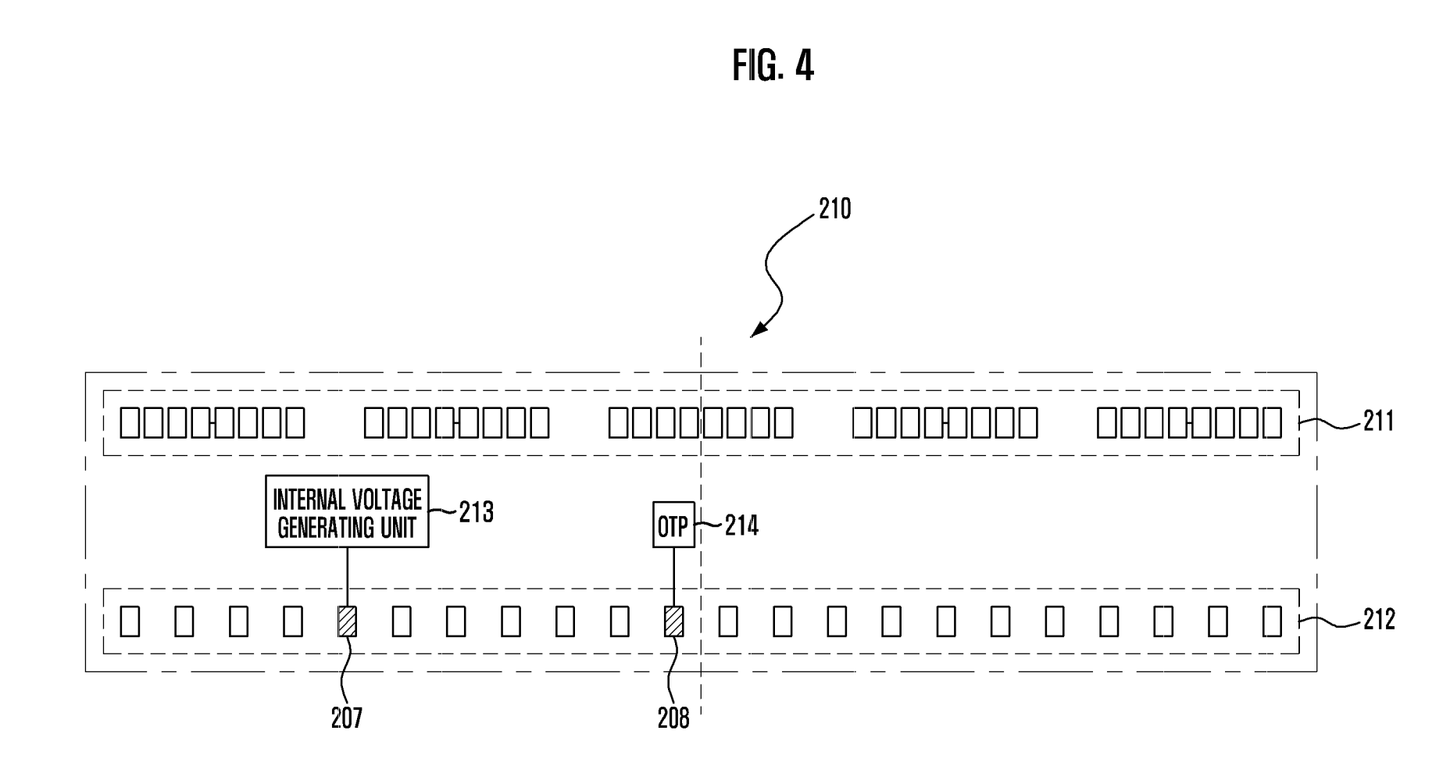
FIG. 4 is a plan view illustrating the rear surface of a display driver IC of FIG. 3.

FIG. 3 is a plan view illustrating a display panel 200 of a display device in accordance with an embodiment of the present invention. FIG. 4 is a plan view illustrating a rear surface of a display driver Integrated Chip (IC) 210 of FIG. 3.

Referring to FIGS. 3 and 4, the display device in accordance with an embodiment of the present invention includes a display panel 200, an internal voltage generating unit 213 receiving an external voltage to generate an internal voltage, and a driver IC 210 including a built-in CTP 214. A first pad 207 outputting the internal voltage and a second pad 208 receiving the writing voltage of the OTP 214 are disposed on the rear surface of the driver IC 210. The display panel 200 includes a lower substrate 201, which will be referred to as a first substrate hereinafter. Herein, first and second connection ports 205 and 206, which are respectively connected to the first and second pads 207 and 208, and an internal interconnection 204 interconnecting the first and second connection ports 205 and 206 are disposed in the upper portion of the first substrate 201.

The driver IC 210 is mounted in a chip on glass (COG) type on the first substrate 201 in order for its rear surface (a surface on which a pad is formed) to be faced with the upper surface (a surface on which a connection port is formed) of the first substrate 201. Moreover, the driver IC 210 may be mounted in various mounting types such as a Chip On Film (COF) type and a tape carrier package (TCP) type.

As illustrated in FIG. 4, a plurality of output pads 211 and a plurality of input pads 212 for interfacing with an external driving circuit are disposed on the rear surface of the driver IC 210. The first and second pads 207 and 208 are any one of the input pads 212. Although not shown, the first and second pads 207 and 208 may be any one of the output pads 211. That is, the dispositions of the first and second pads 207 and 208 are not limited, and the first and second pads 207 and 208 can be disposed in the most suitable position in consideration of the efficiency of a chip layout and chip-operating characteristics according to positions where the internal voltage generating unit 213 and the OTP 214 are formed in the driver IC 210.

The first pad 207 is connected to the output terminal of the internal voltage generating unit 213, and outputs the internal voltage generated from the internal voltage generating unit 213. The second pad 208 is connected to the input terminal of the OTP 214. The second pad 208 receives a writing voltage and applies it to the cell array of the OTP 214 upon writing operation of the OTP 214. There exist input pads between the first and second pads 207 and 208. Although not shown, there may be no input pad between the first and second pads 207 and 208.

The display panel 200 is a liquid crystal panel, and includes the first substrate 201, an upper electrode 202 (hereinafter, referred to as a second substrate) connected to the first substrate 201 and a liquid crystal layer injected between the first and second substrates 201 and 202. A plurality of gate lines, a plurality of data lines, a plurality of TFTs and a plurality of pixel electrodes are formed on the first substrate 201. A plurality of color filters and a common electrode are formed on the second substrate 202. A polarizer 203 may be attached to the both surfaces of the first and second substrates 201 and 202.

A plurality of connection ports (not shown) including the first and second connection ports 205 and 206 are disposed in the one side of the first substrate 201. A portion of the connection ports may be connected to the pads 211 and 212 of the driver IC 210. A portion of the connection ports may be a portion of the pixel electrode or may be a pad connected to the pixel electrode. For convenience of a process, the connection ports may be formed of indium tin oxide (ITO) or indium zinc oxide (IZO). The connection ports may be formed of at least one of an alloy of tin (Sn) and aurum (Au), chromium (Cr), aurum (Au) and aluminum (Al).

The pads 211 and 212 of the driver IC 210 may be attached to the connection ports, and a conductive connection number (not shown) may be attached to the connection ports for a stable connection. Moreover, the driver IC 210 and a flexible substrate (not shown) (a substrate for interfacing with a driving circuit) are mounted on the conductive connection number by a heat-press process. The conductive connection number may use an Anisotropic Conductive Film (AFC) or a solder. The solder may be formed of at least one of an alloy of tin (Sn) and aurum (Au), chromium (Cr), aurum (Au) and aluminum (Al).

The internal interconnection 204 for connecting the first and second connection ports 205 and 206 may be formed in the same layer as a layer where the gate line or the data line formed on the first substrate 201 is formed. This may be defined together upon forming process of the lines, i.e, a patterning process (an etching process). The internal interconnection 204 may be formed of any one metal selected from the group consisting of Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs, Al, and an alloy thereof.

Embodiment 2

Figure 5:
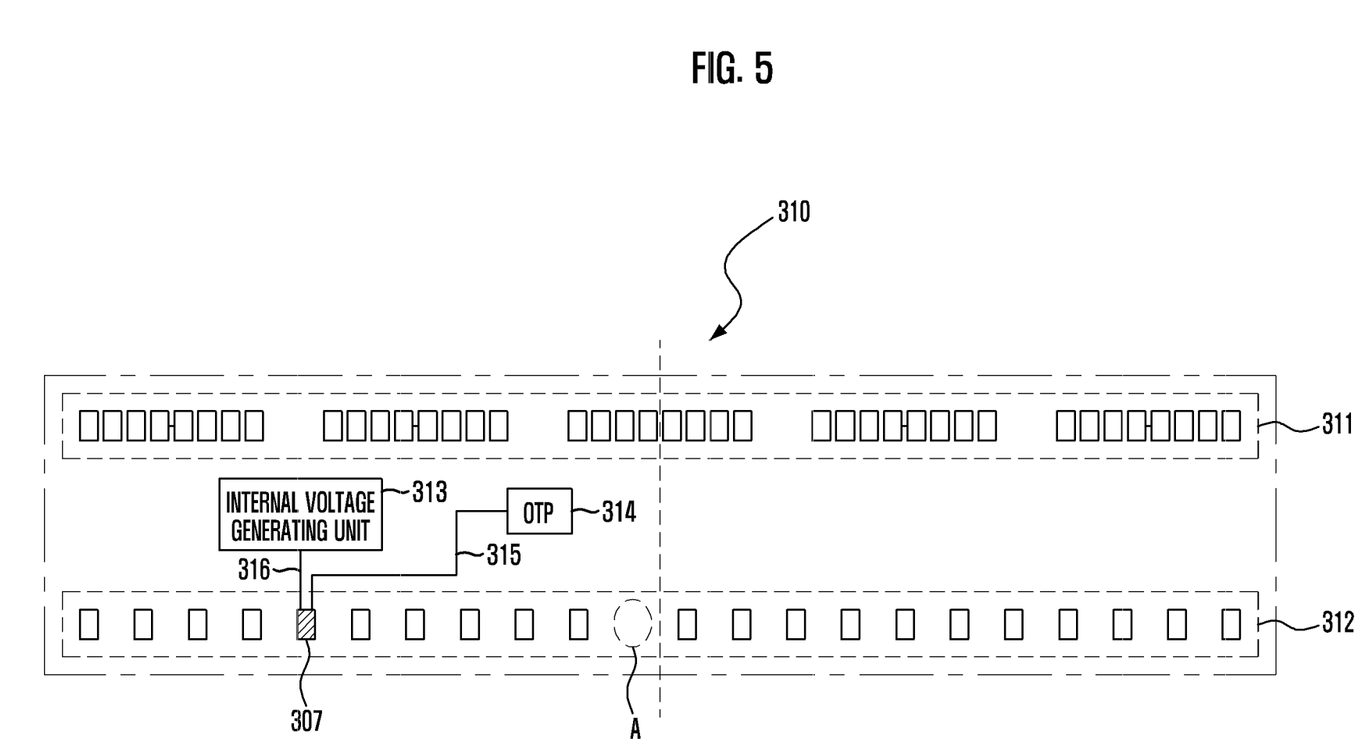
FIG. 5 is a plan view illustrating the rear surface of the display driver IC in accordance with another embodiment of the present invention.

FIG. 5 is a plan view illustrating the rear surface of the display driver IC 310 in accordance with another embodiment of the present invention.

Referring to FIG. 5, the display driver IC 310 in accordance with another embodiment of the present invention includes an internal voltage generating unit 313 receiving an external voltage to generate an internal voltage, and a built-in OTP 314. Moreover, the OTP 314 receives the internal voltage generated from the internal voltage generating unit 313 upon writing operation, and is connected to the internal voltage generating unit 313 through a first internal interconnection 315 in order to use the internal voltage as a writing voltage.

A plurality of output pads 311 and a plurality of input pads 312 for interfacing with an external driving circuit are disposed in the rear surface of the driver IC 310. The pad 307 connected to the output terminal of the internal voltage generating unit 313 among the input pads 312 outputs the internal voltage outputted from the internal voltage generating unit 313. Moreover, the pad 307 is connected to the input terminal of the OTP 314 through the first internal interconnection 315, and applies the writing voltage to the cell array of the OTP 314 upon writing operation of the OTP 314. Although not shown, the first internal interconnection 315 connected to the input terminal of the OTP 314 is not directly connected to the pad 307, whereas it may directly be connected to a second internal interconnection 316 which applies the internal voltage generated from the internal voltage generating unit 313 to the pad 307.

In a pad arranging structure, the driver IC 310 in accordance with another embodiment of the present invention has a structure similar to that of the driver IC 210 (see FIG. 4) in accordance with an embodiment of the present invention. However, there exits no pad connected to the input terminal of the OTP 314 (a terminal receiving the writing voltage upon writing operation) (see A). In this way, since another embodiment of the present invention does not form a pad (for the writing voltage of the OTP 314) in the rear surface of the driver IC 310, and thus it can efficiently improve the pad area of the driver IC 310 in proportion thereto.

As described above, upon OTP writing operation, embodiments of the present invention do not use the external voltage as the writing voltage but use the internal voltage generated from the internal voltage generating unit as the writing voltage. For this, in a state where the first and second pads 207 and 208 are left in the rear surface of the driver IC 210 as they are, an embodiment of the present invention interconnects the connection ports 205 and 206, which are formed to be faced with the respective first and second pads 207 and 208 on the first substrate 210 of the display panel 200, through the internal interconnection 204. Another embodiment of the present invention interconnects the pad 307 connected to the output terminal of the internal voltage generating unit 313 and the input terminal of the OTP 314 through the first internal interconnection 315 in the driver IC 310, or interconnects the first internal interconnection 315 connected to the input terminal of the OTP 314 and the second internal interconnection 316 connected to the output terminal of the internal voltage generating unit 313.

Figure 6:
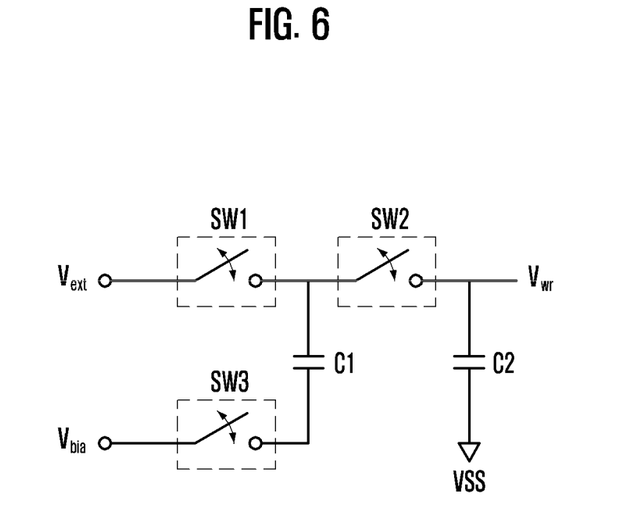
FIG. 6 is a circuit diagram of an internal voltage generating unit in accordance with an embodiment of the present invention.

In embodiments of the present invention, as illustrated in FIG. 6, the internal voltage generating unit uses a charge pump type including two capacitors C1 and C2 and three switching units SW1 to SW3. Moreover, as illustrated in FIG. 7, the internal voltage generating unit may use a Switching Mode Power Supply (SMPS) type including an inductor L, a diode D, a transistor NM and a capacitor C.

Figure 7:
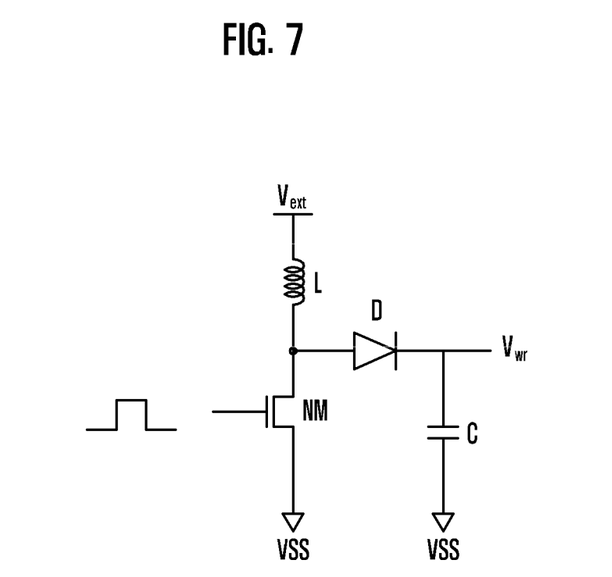
FIG. 7 is a circuit diagram of an internal voltage generating unit in accordance with an embodiment of the present invention.

As illustrated in FIGS. 6 and 7, the internal voltage generating unit uses the capacitor for receiving an external voltage $V_{ext}$ to generate an internal voltage, i.e., a writing voltage $V_{wr}$. The internal voltage generating unit cannot continuously supply a constant level of the writing voltage like the external voltage because of characteristics of the capacitor.

Figure 8A:
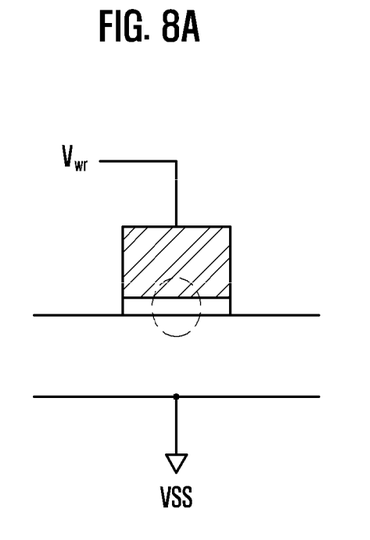
FIGS. 8A to 8D are conceptual diagrams for describing the voltage drop of an internal voltage upon OTP writing operation.
Figure 8B:
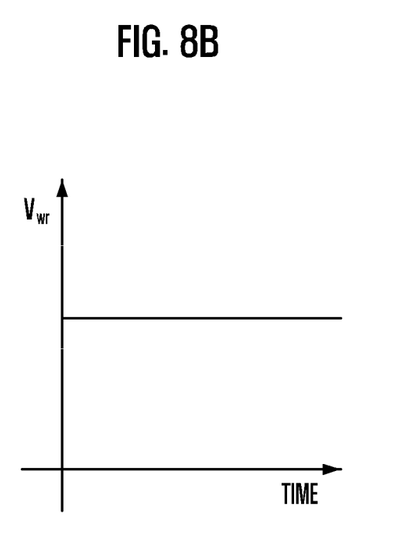
Figure 8C:
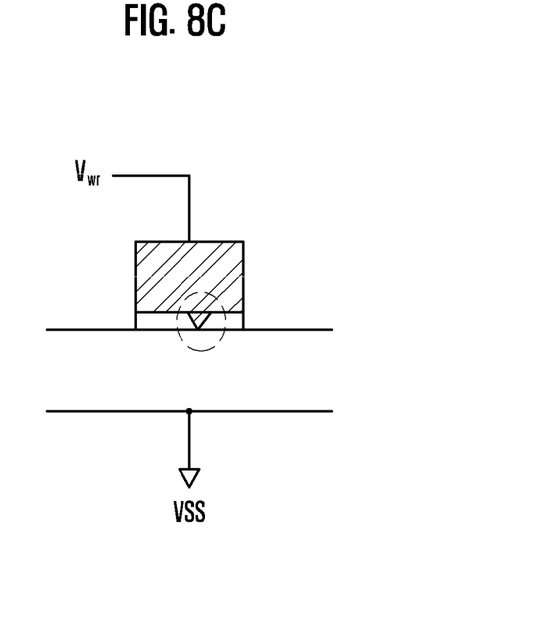
Figure 8D:
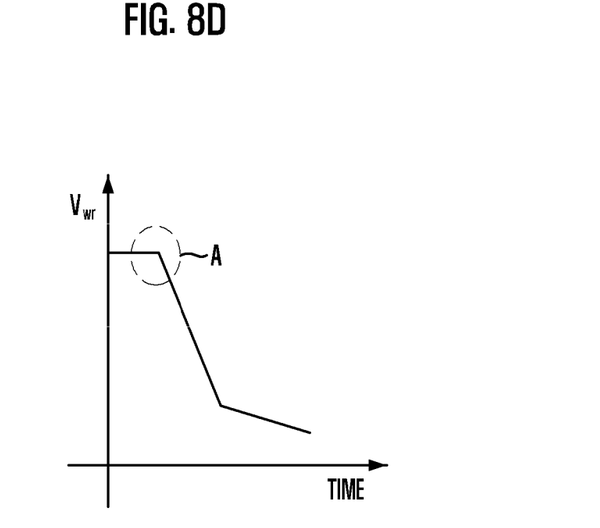

As illustrated in FIGS. 8A and 8B, the voltage drop of the writing voltage $V_{wr}$ does not occur because the dielectric breakdown of the gate dielectric of an anti-fuse is not caused in an initial writing operation. However, as illustrated in FIGS. 8C and 8D, in a case where the dielectric breakdown of the gate dielectric of the anti-fuse is partly caused (see a circle), the voltage drop of the writing voltage $V_{wr}$ occurs (see A). In this way, when the voltage drop of the writing voltage $V_{wr}$ occurs it is impossible to apply a constant level of the writing voltage $V_{wr}$ to the anti-fuse, and thus a writing fail can occur. In a case where the writing operation is performed on a plurality of bits instead of one bit, this state goes worse.

Accordingly, the following description will be made on the OTP capable of preventing the voltage drop of the writing voltage in a case that uses the internal voltage instead of the external voltage as the writing voltage upon OTP writing operation.

Figure 9:
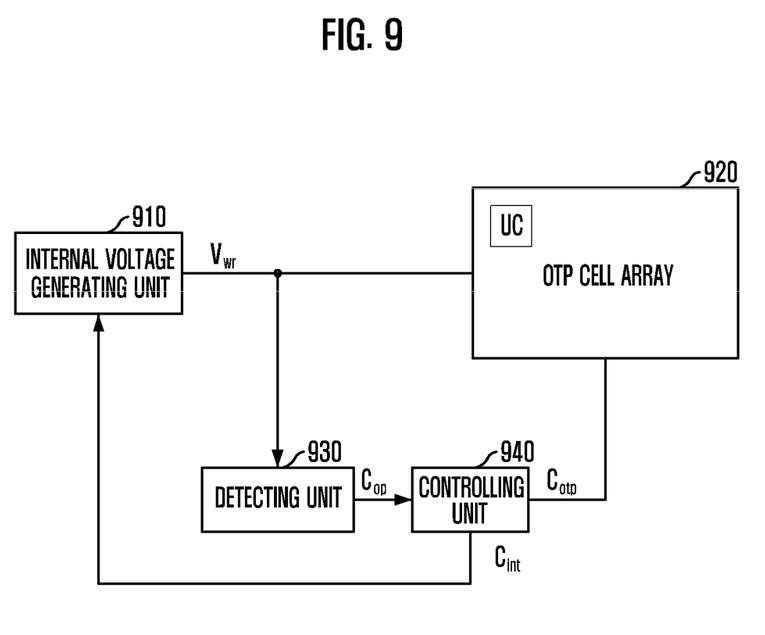
FIG. 9 is a block diagram of the OTP capable of preventing the voltage drop of a writing voltage.

FIG. 9 is a block diagram of the OTP capable of preventing the voltage drop of the writing voltage.

Referring to FIG. 9, the OTP includes a plurality of OTP unit cells, a cell array 920 receiving a writing voltage $V_{wr}$ generated from an internal voltage generating unit 910 to operate upon writing operation, a detecting unit 930 detecting the change of the writing voltage $V_{wr}$, a controlling unit 940 controlling the operation of the unit cell of the internal voltage generating unit 910 according to the output signal $C_{op}$ of the detecting unit 930.

As illustrated in FIGS. 6 and 7, the internal voltage generating unit 910 may be configured in the charge pump type or the SMPS type.

Figure 10:
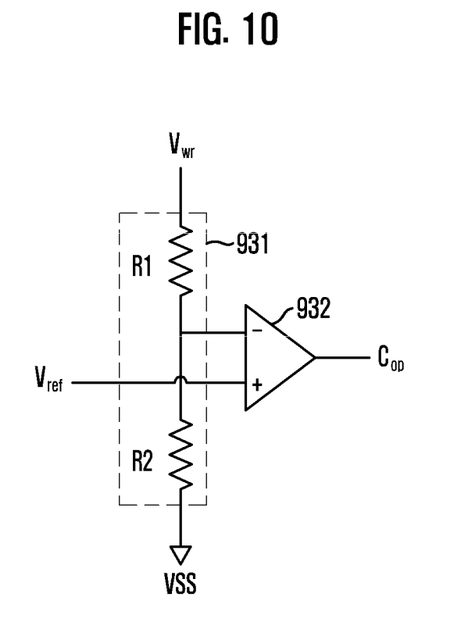
FIG. 10 is a circuit diagram of an embodiment of a detecting unit of FIG. 9.
Figure 11:
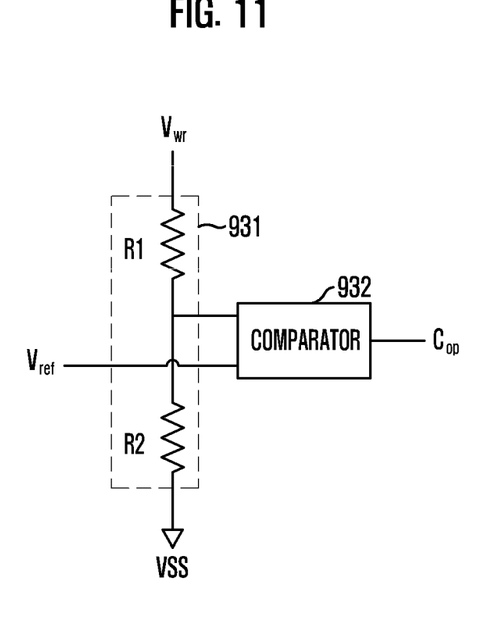
FIG. 11 is a circuit diagram of another embodiment of a detecting unit of FIG. 9.

The detecting unit 930 includes a voltage divider 931 dividing the writing voltage $V_{wr}$, a comparator 932 comparing a division voltage divided through the voltage divider 931 with a reference voltage $V_{ref}$. Specifically, as illustrated in FIGS. 10 and 11, the voltage divider 931 includes two resistors R1 and R2 which are connected in series. The comparator 932 uses a differential amplifier (see FIG. 10) as an analog comparator, and may use a logic gate (see FIG. 11) as a digital comparator. For example, the logic gate may use an AND gate, a NOR gate, a NAND gate and/or an OR gate. The detecting unit 930 detects the writing voltage $V_{wr}$, and outputs a logic high level of the output signal $C_{op}$ (1) or a logic low level of the output signal $C_{op}$ (0) according to the detected voltage.

The controlling unit 940 generates a first control signal $C_{int}$ for controlling the internal voltage generating unit 910 and a second control signal $C_{otp}$ for controlling the operation of the unit cell of the cell array 920 according to the output signal $C_{op}$ of the detecting unit 930. For example, in a case where the voltage drop of the writing voltage $V_{wr}$ occurs, the controlling unit 940 outputs the first control signal $C_{int}$ to the internal voltage generating unit 910 in order for the internal voltage generating unit 910 to generate the writing voltage $V_{wr}$, and simultaneously outputs the second control signal $C_{otp}$ to the OTP cell array 920 to thereby stop the writing operation of the unit cell. Subsequently, when the writing voltage $V_{wr}$ rises by the voltage drop of the writing voltage $V_{wr}$, the controlling unit 940 stops the internal voltage generating unit 910 by the first control signal $C_{int}$ and simultaneously allows the writing operation of the unit cell to be performed by the second control signal $C_{otp}$.

Figure 12A:
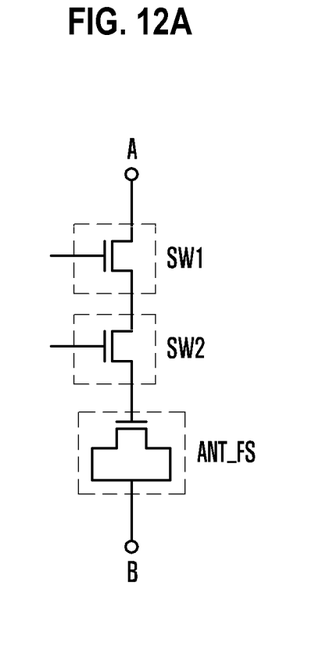
FIGS. 12A and 12B are circuit diagrams of an OTP unit cell in accordance with embodiments of the present invention.
Figure 12B:
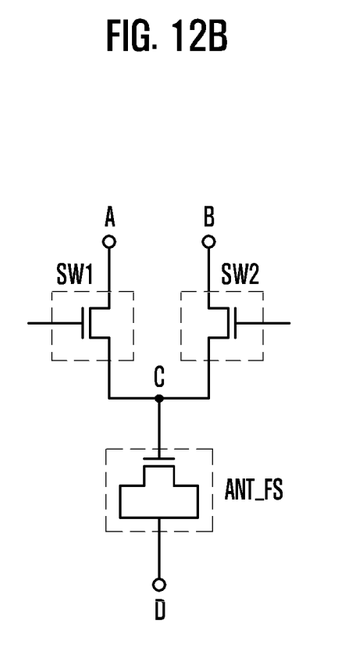

As illustrated in FIG. 12A, the unit cell includes first and second switching units SW1 and SW2 which are connected between first and second nodes A and B in series, and an anti-fuse ANT_FS which is connected between the second switching unit SW2 and the second node B. Moreover, as illustrated in FIG. 12B, the unit cell may include a first switching unit SW1 which is connected between first and second nodes A and C, a second switching unit SW2 which is connected between a third node B and the second node C, and an anti-fuse ANT_FS which is connected between the second node C and a fourth node D. Herein, the first and second switching units SW1 and SW2 may include an n-channel transistor and a p-channel transistor, respectively. The anti-fuse ANT_FS may include a transistor. Moreover, although not shown, the anti-fuse ANT_FS may include a capacitor.

According to embodiments of the present invention, the display driver IC, which includes the built-in internal voltage generating unit and the built-in memory device having the one-time programmable function, receives the writing voltage from the internal voltage generating unit without using the external voltage as the writing voltage upon writing operation of the memory device, and thus it is not affected by noise due to the pad for the writing voltage of the memory device. Moreover, since there is no need that the pad for the writing voltage of the memory device is formed in the display driver IC, the efficiency of the pad area of the display driver IC can be enhanced.

While the present invention has been described with respect to the specific embodiments, it will be apparent to those skilled in the art that various changes and modifications may be made without departing from the spirit and scope of the invention as defined in the following claims.

What is claimed is:

1. A display device, comprising:
   a display panel; and
   a driver integrated circuit (IC) comprising
      a built-in internal voltage generating unit configured to generate an internal voltage,
      a built-in memory device having a one-time programmable function,
      a first pad configured to output the internal voltage, and
      a second pad configured to receive a writing voltage of the memory device,
   wherein the display panel comprises:
   first and second connection ports connected to the respective first and second pads upon mounting of the driver IC; and
   a first substrate, an internal interconnection configured to interconnect the first and second connection ports being disposed on the first substrate; and
   wherein the built-in memory device receives the internal voltage generated from the built-in internal voltage generating unit as a writing voltage through the second pad.

2. The display device of claim 1, wherein the driver IC is mounted in any one of a chip on glass type, a chip on film type and a tape carrier package type.

3. The display device of claim 1, further comprising:
   a conductive connection number formed on the first and second connection ports.

4. The display device of claim 3, wherein the conductive connection number is an anisotropic conductive film or a solder.

5. The display device of claim 1, wherein the first and second connection ports comprise any one of indium tin oxide, indium zinc oxide, an alloy of tin and aurum, chromium, aurum and aluminum.

6. The display device of claim 1, wherein the internal interconnection comprises any one selected from the group consisting of Ce, Pr, Nd, Pm, Sm, Eu, Gd, Tb, Dy, Ho, Er, Tm, Yb, Lu, Ni, Ti, Co, Cu, Pt, W, Cr, Mo, Au, Ag, Zn, Ir, Ta, Hf, K, Li, Cs, Al, and an alloy thereof.

7. The display device of claim 1, wherein the display panel comprises:
   a second substrate connected to the first substrate; and a liquid crystal layer injected between the first and second substrates.

8. The display device of claim 1, wherein the first pad connects to an output terminal of the built-in voltage generating unit; the second pad connects an input terminal of the built-in memory device; and the built-in memory device receives the internal voltage generated from the built-in internal voltage generating unit as the writing voltage through the second pad and performs the one-time programmable function without receiving an external voltage as the writing voltage during the writing operation of the built-in memory device.

9. The display device of claim 1, wherein the writing operation of the built-in memory device involves a dielectric breakdown of a dielectric material in an anti-fuse in the built-in memory device.

10. The display device of claim 9, wherein the anti-fuse comprises a capacitor or a transistor.

* * * * *